(12) United States Patent
Magnus et al.

(10) Patent No.: US 9,401,338 B2
(45) Date of Patent: Jul. 26, 2016

(54) ELECTRONIC DEVICES WITH EMBEDDED DIE INTERCONNECT STRUCTURES, AND METHODS OF MANUFACTURE THEREOF

(71) Applicants: Alan J. Magnus, Gilbert, AZ (US); Francisco Chaidez, Phoenix, AZ (US)

(72) Inventors: Alan J. Magnus, Gilbert, AZ (US); Francisco Chaidez, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 92 days.

(21) Appl. No.: 13/688,820

(22) Filed: Nov. 29, 2012

(65) Prior Publication Data
US 2014/0145325 A1    May 29, 2014

(51) Int. Cl.
*H01L 23/48* (2006.01)
*H01L 23/00* (2006.01)
*H01L 25/065* (2006.01)
(Continued)

(52) U.S. Cl.
CPC ............... *H01L 24/19* (2013.01); *H01L 24/48* (2013.01); *H01L 24/73* (2013.01); *H01L 24/85* (2013.01); *H01L 24/96* (2013.01); *H01L 25/03* (2013.01); *H01L 25/0652* (2013.01); *H01L 25/50* (2013.01); *H01L 21/561* (2013.01); *H01L 21/568* (2013.01); *H01L 23/5389* (2013.01); *H01L 24/49* (2013.01); *H01L 25/18* (2013.01); *H01L 2224/32225* (2013.01); *H01L 2224/48091* (2013.01); *H01L 2224/48137* (2013.01); *H01L 2224/48145* (2013.01); *H01L 2224/48227* (2013.01); *H01L 2224/48228* (2013.01); *H01L 2224/48247* (2013.01); *H01L 2224/48464* (2013.01); *H01L 2224/48482* (2013.01); *H01L 2224/49175* (2013.01); *H01L 2224/73227* (2013.01); *H01L 2224/73265* (2013.01); *H01L 2224/85051* (2013.01); *H01L 2924/00014* (2013.01); *H01L 2924/181* (2013.01);
(Continued)

(58) Field of Classification Search
CPC ... H01L 23/315; H01L 23/48; H01L 2924/00; H01L 2924/15; H01L 2924/161; H01L 2225/06558
USPC .......................................... 257/737; 438/109
See application file for complete search history.

(56) References Cited

U.S. PATENT DOCUMENTS 6,420,244 B2    7/2002    Lee
7,030,469 B2    4/2006    Mahadevan et al.
(Continued)

OTHER PUBLICATIONS

U.S. Appl. No. 13/592,764, P.H. Bowles, Sensor Packages and Method of Packing Dies of Differing Sizes, filed Aug. 23, 2012.
(Continued)

*Primary Examiner* — Thao X Le
*Assistant Examiner* — Laura Dykes
(74) *Attorney, Agent, or Firm* — Sherry W. Schumm

(57) ABSTRACT

An embodiment of an electronic device includes an IC die with a top surface and a bond pad exposed at the top surface. A stud bump (or stack of stud bumps) is connected to the bond pad, and the stud bump and die are encapsulated with encapsulant. A trench is formed from a top surface of the encapsulant to the stud bump, resulting in the formation of a trench-oriented surface of the stud bump, which is exposed at the bottom of the trench. An end of an interconnect is connected to the trench-oriented surface of the stud bump. The interconnect extends above the encapsulant top surface, and may be coupled to another IC die of the same electronic device, another IC die that is distinct from the device, or another conductive feature of the device or a larger electronic system in which the device is incorporated.

19 Claims, 11 Drawing Sheets

(51) Int. Cl.
*H01L 25/03* (2006.01)
*H01L 25/00* (2006.01)
*H01L 21/56* (2006.01)
*H01L 23/538* (2006.01)
*H01L 25/18* (2006.01)

(52) U.S. Cl.
CPC .............. *H01L2924/1815* (2013.01); *H01L 2924/18165* (2013.01)

(56) References Cited

U.S. PATENT DOCUMENTS

| | | | |
|---|---|---|---|
| 7,939,916 | B2 | 5/2011 | O'Donnell et al. |
| 8,174,119 | B2 | 5/2012 | Pendse |
| 2004/0072396 | A1* | 4/2004 | Tiziani et al. ............ 438/200 |
| 2004/0262811 | A1* | 12/2004 | Lee et al. ............ 264/272.11 |
| 2006/0108666 | A1* | 5/2006 | Koizumi ............ 257/621 |
| 2007/0023886 | A1* | 2/2007 | Hedler et al. ............ 257/686 |
| 2007/0158833 | A1* | 7/2007 | Park ............ H01L 21/561 257/734 |
| 2008/0073769 | A1* | 3/2008 | Wu et al. ............ 257/686 |
| 2009/0008728 | A1* | 1/2009 | Fujii et al. ............ 257/415 |
| 2013/0099387 | A1* | 4/2013 | Caskey et al. ............ 257/774 |

OTHER PUBLICATIONS

U.S. Appl. No. 13/588,205, P.H. Bowles, et al., "Sensor Packages and Method of Packing Dies of Various Sizes", filed Aug. 17, 2012.

* cited by examiner

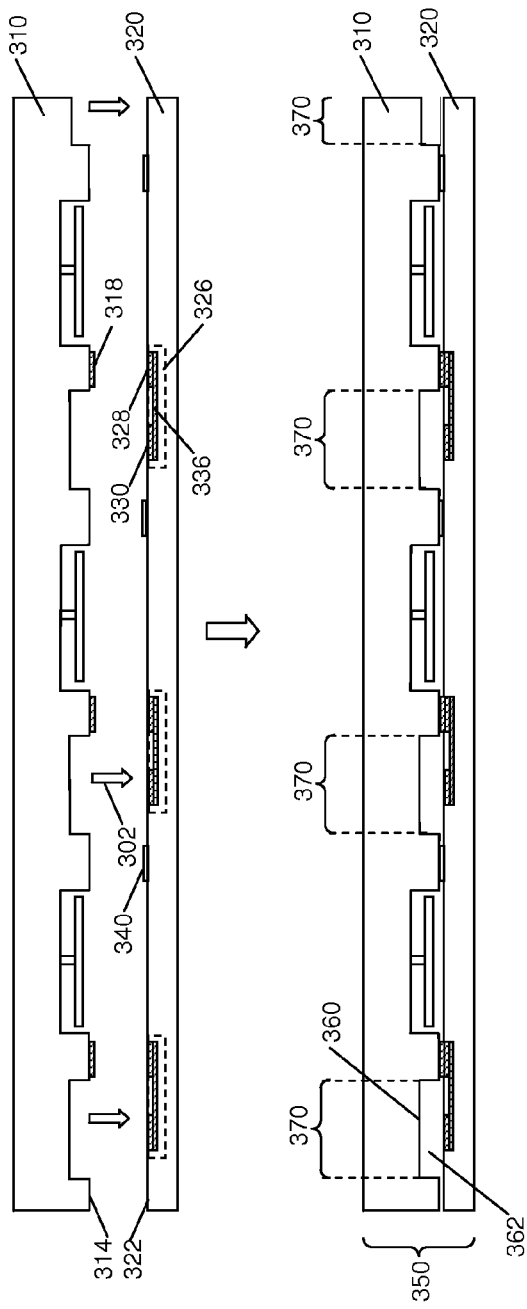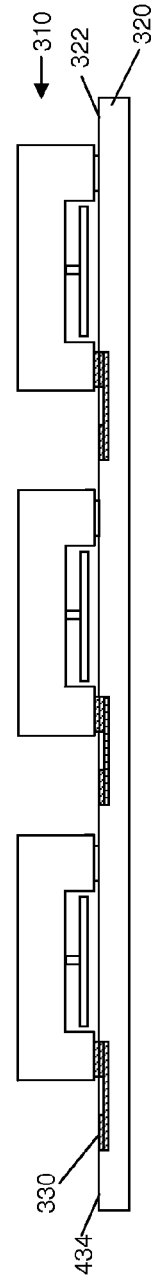

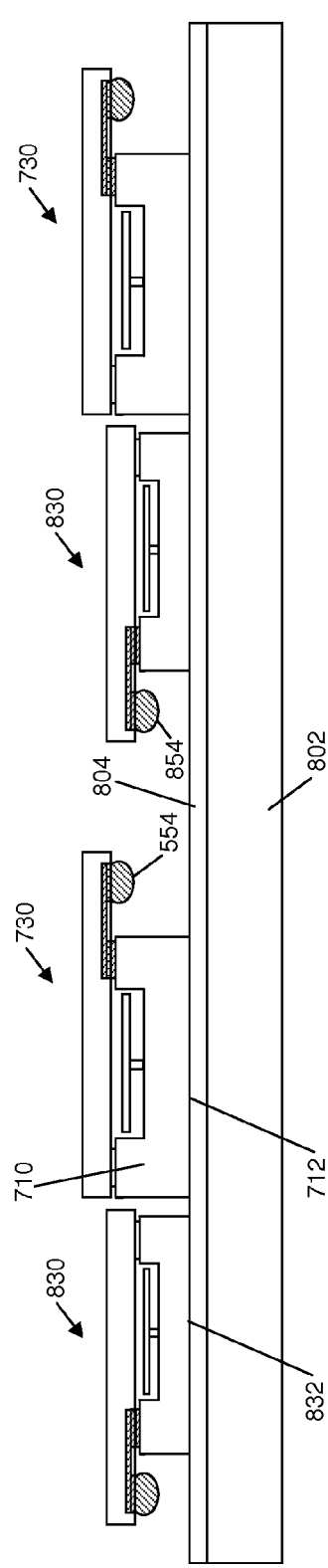
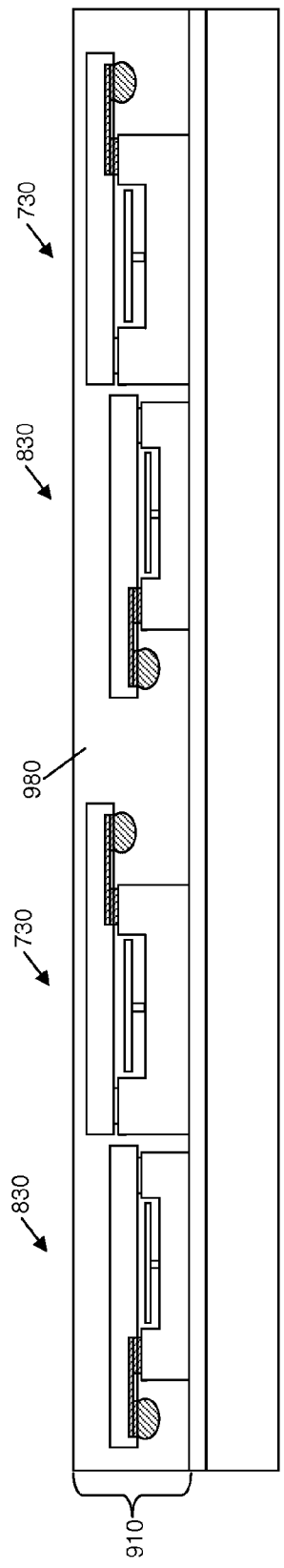

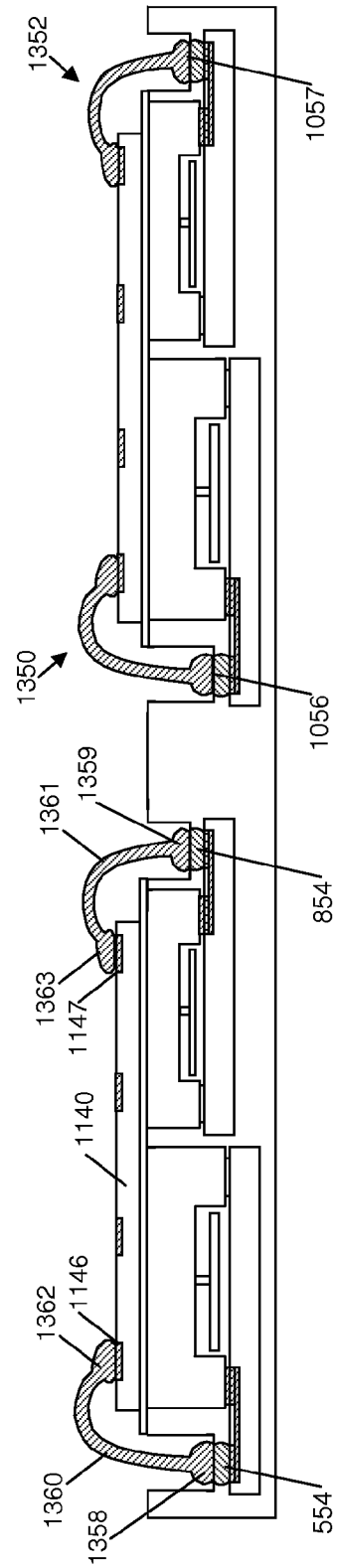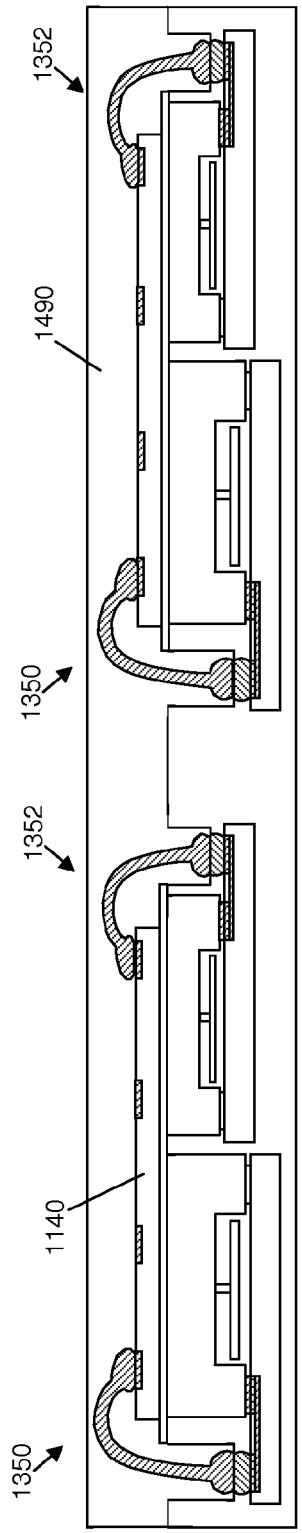
FIG. 13
FIG. 14

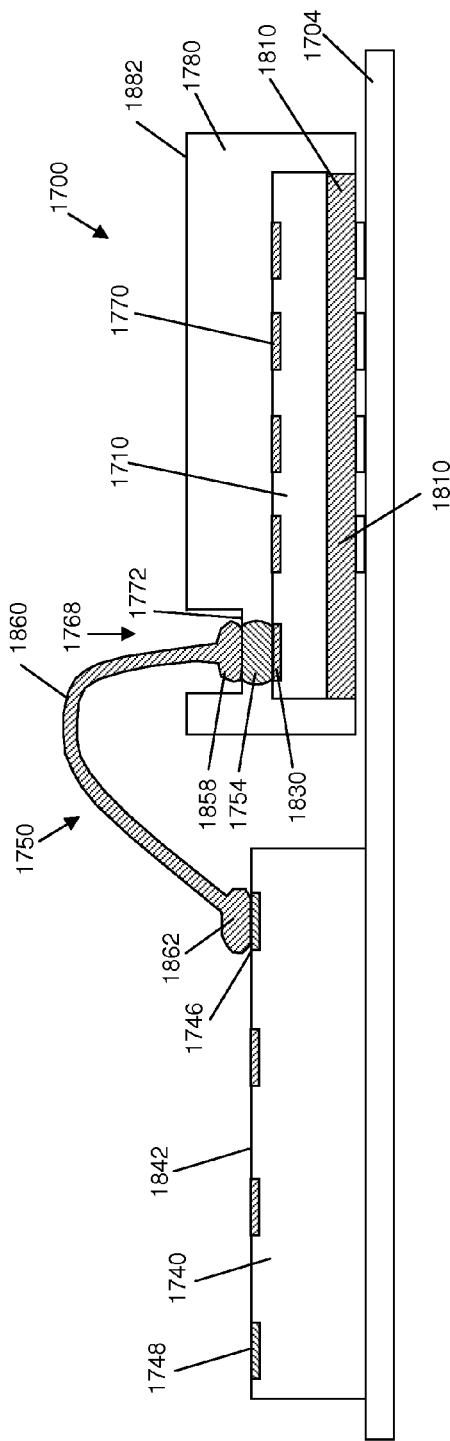
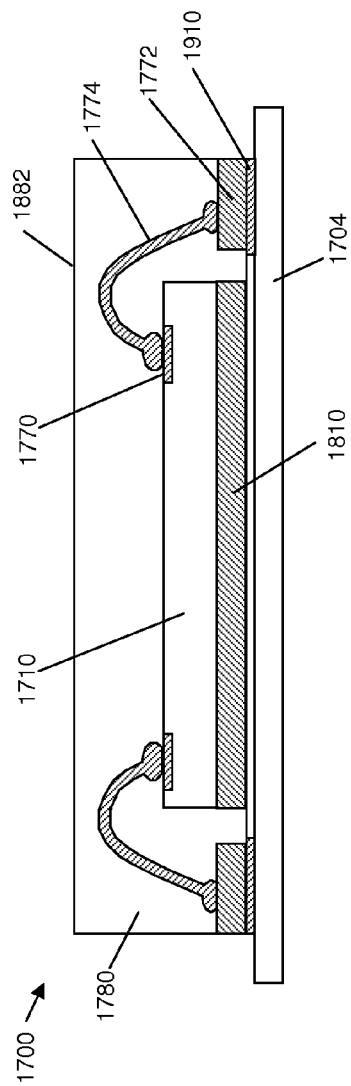
FIG. 18
FIG. 19

ELECTRONIC DEVICES WITH EMBEDDED DIE INTERCONNECT STRUCTURES, AND METHODS OF MANUFACTURE THEREOF

TECHNICAL FIELD

Embodiments of the subject matter described herein relate generally to electronic devices with embedded die and interconnect structures, and methods of their manufacture.

BACKGROUND

In an overmolded electronic device package, an integrated circuit die is covered with encapsulation material in order to protect the die from the external environment. In a typical manufacturing process, the integrated circuit die is placed on a leadframe prior to encapsulation, and wirebonds are connected between the die's contacts and leads of the leadframe. Encapsulation material is then applied to substantially surround the integrated circuit die and the wirebonds, and to partially surround the leads.

Although such packaging techniques have worked well for many years, they constrain the development of some new device configurations. For example, an emerging industry trend is to include multiple die within a single package in order to increase the capabilities of a device. In some cases, multiple die may be stacked, interconnected, and encapsulated together. Development of such configurations is limited in that electrical connections to all contacts need to be established before the encapsulation is applied. Otherwise, unconnected contacts would be embedded in the encapsulation material and, thus, would not be externally accessible. What are needed are packaging techniques that permit the development of new electronic device configurations.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 3-15 illustrate various views of an electronic device during the steps of the manufacturing process of FIG. 2, in accordance with various embodiments;

FIGS. 17-19 illustrate various views of a system that includes an electronic device with embedded die and embedded stud bumps, in accordance with another alternate embodiment.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments include electronic devices with embedded interconnect structures, and methods of their manufacture. As will be apparent from the Figures and the detailed description, the various embodiments may allow for the development of new and potentially more powerful electronic device configurations, because the methods enable embedded contacts to be accessed for interconnection with external devices.

Figure 1:
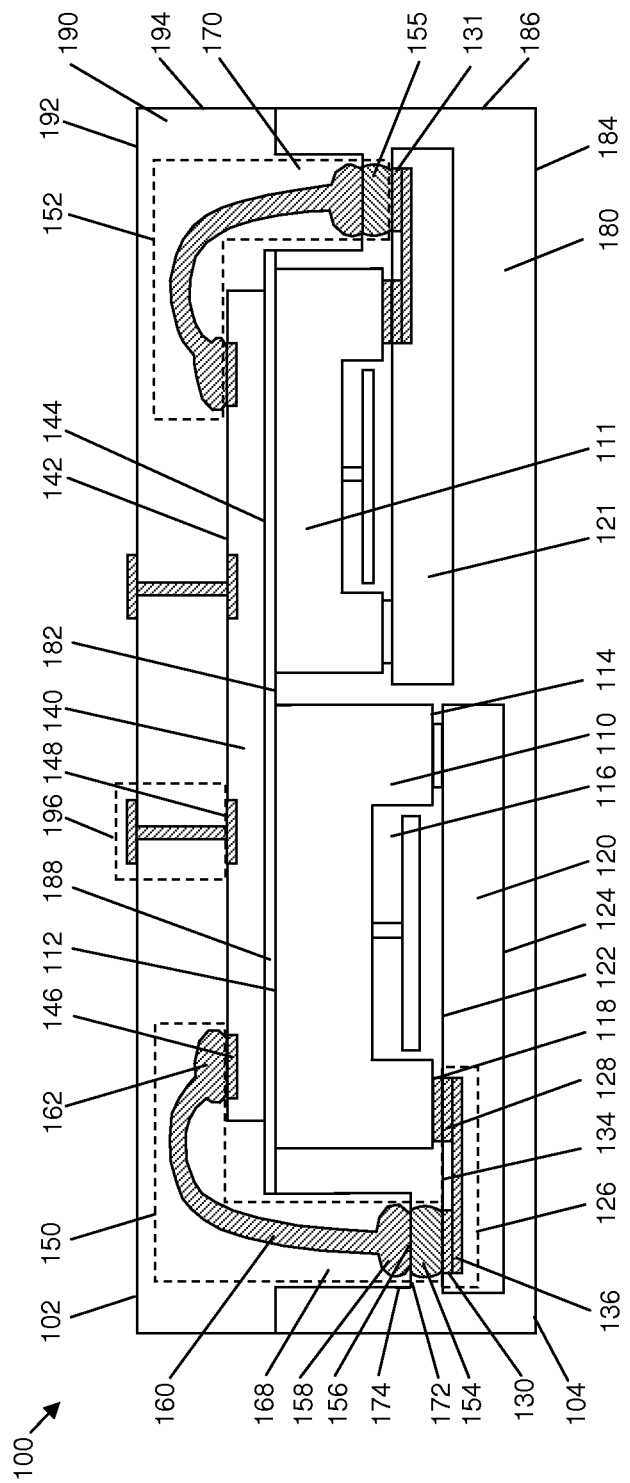
FIG. 1 is a cross-sectional, side view of an electronic device with embedded die and interconnect structures, in accordance with an example embodiment.

FIG. 1 is a cross-sectional, side view of an electronic device 100 with embedded die 110, 111, 120, 121, 140 and interconnect structures 150, 152, in accordance with an example embodiment. Device 100 may be any of numerous types of electronic devices. For purposes of example, device 100 is described to be a device configured to perform sensor functions (e.g., including an accelerometer, a gyroscope, a pressure sensor, and/or associated control and processing circuitry). However, it should be understood that device 100 alternatively may be any other type of device that may benefit from features of the various embodiments (e.g., a device in which embedded connections to an integrated circuit is desired).

According to a particular embodiment, device 100 includes multiple sets of stacked die that are encapsulated with first encapsulant 180 (e.g., bulk mold compound). For example, in the illustrated embodiment, device 100 has a first set of stacked die that includes die 110, 120, and a second set of stacked die that includes die 111, 121. The first encapsulant 180 holds the first and second sets of stacked die in fixed orientation, with respect to each other. In other embodiments, a device may include a single set of stacked die, more than two sets of stacked die, or die that are not stacked (e.g., as in the embodiment illustrated in FIGS. 17-19). As used herein, the term "stacked," when referring to an orientation of multiple integrated circuit die, means that the multiple integrated circuit die are bonded directly to each other. As used herein, a "set" of stacked die (or a "stacked die set") means two or more integrated circuit die that are stacked. Although FIGS. 1 and 7-16 illustrate sets of stacked die that include only two die, a set of stacked die may include three or more die, in other embodiments. Additionally, when reference is made to "encapsulating" a die or other feature, the die or other feature may be completely or partially encompassed by an encapsulant. In other words, "encapsulating" should not be interpreted to mean that every portion or surface of the die or other feature is covered by encapsulant (e.g., one or more surfaces may remain uncovered by encapsulant, or may be contacted by other die or features), unless otherwise specified. Similarly, the term "encompassed" should be interpreted to mean either fully encompassed or partially encompassed, unless otherwise specified.

For example, die 110, 111 each may be a sensor die, which is configured to sense one of various types of forces. For purposes of differentiating die 110, 111 from other features of device 100 (e.g., from other die), die 110, 111 will be referred to below as "sensor die." However, it is to be understood that either or both of die 110 and/or 111 may perform functions other than force sensing functions. Accordingly, the use of the term "sensor die" should not be construed as limiting. For simplicity of description, various features of sensor die 110 are described in more detail than the features of sensor die 111. It should be understood that the description, below, relating to sensor die 110 also may apply to sensor die 111. Alternatively, die 111 may have significantly different physical and/or functional features from die 110.

Sensor die 110 has a top surface 112, a bottom surface 114, an air cavity 116, and a plurality of contacts 118 (e.g., bond pads). Various sensing components of the sensor die 110 are exposed at the bottom surface 114, but are hermetically sealed within air cavity 116. The plurality of contacts 118 also are exposed at the bottom surface 114 of sensor die 110, in an embodiment. Certain ones of the contacts 118 may correspond to inputs for receiving control signals and voltage references (e.g., power and ground), for example, and other ones of the contacts 118 may correspond to outputs for conveying signals indicative of forces sensed by the sensing components of the die 110. Sensor die 110 also may include other conductive structures, passive and/or active components, processing circuitry, and/or other features (not shown). According to an embodiment, the top surface 112 of sensor die 110 is co-planar with a top surface 182 of the first encapsulant 180. In another embodiment, the top surface 112 of sensor die 110 may be covered by the first encapsulant 180. The bottom surface 114 of sensor die 110 is connected to the top surface 122 of die 120, so that sensor die 110 and die 120 form a set of stacked die.

Die 120 may be configured as a cap die, which functions in part to seal and protect the air cavity 116 of sensor die 110 (e.g., die 120 "caps" the air cavity 116). Accordingly, for purposes of differentiating die 120, 121 from other features of device 100 (e.g., from other die), die 120, 121 will be referred to below as "cap die." However, it is to be understood that either or both of die 120 and/or 121 may perform functions other than capping the air cavity 116, as will be explained below. Accordingly, the use of the term "cap die" should not be construed as limiting. For simplicity of description, various features of cap die 120 are described in more detail than the features of cap die 121. It should be understood that the description, below, relating to cap die 120 also may apply to cap die 121. Alternatively, die 121 may have significantly different physical and/or functional features from die 120.

Cap die 120 includes top surface 122, a bottom surface 124, and a plurality of conductive structures 126. According to an embodiment, the conductive structures 126 of cap die 120 are configured to convey signals and voltage references between external circuitry (e.g., die 140 or other circuitry) and sensor die 110. For example, each conductive structure 126 may include a first contact 128 (e.g., a bond pad) arranged in a location that aligns with a corresponding contact 118 of the sensor die 110, a second contact 130 exposed at a portion of the top surface 122 that functions as a contact shelf 134, and a conductive trace or path 136 that electrically couples the first and second contacts 128, 130. The conductive trace or path 136 may include portions located on the top surface 122 of die 120 and/or portions on layers below the top surface 122 of die 120 (along with vias or other structures electrically connecting conductive material on different layers or surfaces). Die 120 also may include other conductive structures, passive and/or active components, processing circuitry, and/or other features (not shown). According to an embodiment, certain ones of the conductive structures 126 correspond to paths for conveying control signals and voltage references (e.g., power and ground) to the sensor die 110 from external circuitry (e.g., die 140 or other circuitry), and other ones of the conductive structures 126 correspond to paths for conveying signals indicative of forces sensed by the sensing components of the sensor die 110 to the external circuitry.

The external circuitry functions as a source of the control signals and voltage references conveyed by the conductive structures 126 to the sensor die 110, and as a consumer of the signals indicative of forces sensed by the sensing components of the sensor die 110, in an embodiment. The external circuitry may form additional portions of device 100, in an embodiment, or some or all of the external circuitry may be distinct from the device (e.g., in a separately packaged device or a distinct integrated circuit die). According to a particular embodiment, device 100 includes die 140 (e.g., an application specific integrated circuit), which is configured to provide control signals and voltage references, and to receive and process signals from the sensor die 110. For purposes of differentiating die 140 from other features of device 100 (e.g., from other die), die 140 will be referred to below as "control and processing die." However, it is to be understood that die 140 may perform functions other than control and/or processing functions. Additionally, the control and processing functions may be performed by multiple die. Accordingly, the use of the term "control and processing die" and the depiction of a single die for performing these purposes should not be construed as limiting. In addition, in other embodiments, control and/or processing functions may be performed by circuitry that is distinct from device 100 (e.g., separately encapsulated), in other embodiments.

In an embodiment, the control and processing die 140 is positioned above the co-planar top surfaces 112, 182 of the sensor die 110 and the first encapsulant 180. For example, a bottom surface 144 of the control and processing die 140 may be coupled to either or both of the top surfaces 112, 182 of the sensor die 110 and first encapsulant 180 with an adhesive layer 188 or other means.

Along with circuitry (not illustrated) for performing control and/or processing functions, the control and processing die 140 includes a plurality of contacts 146 (e.g., bond pads) exposed at a top surface 142 of the control and processing die 140. According to an embodiment, certain ones of the contacts 146 correspond to outputs for conveying control signals and voltage references (e.g., power and ground) to the sensor die 110 (via cap die 120), and other ones of the contacts 146 correspond to inputs for receiving (via cap die 120) signals indicative of forces sensed by the sensing components of the sensor die 110.

According to an embodiment, device 100 includes a plurality of interconnect structures 150, which function to convey the various signals and voltage references between the contacts 146 of control and processing die 140 and the contacts 130 of cap die 120. As discussed previously, in alternate embodiments, control and/or processing functions may be performed by multiple die and/or circuitry that are distinct from device 100 (e.g., a separately packaged device or a distinct integrated circuit die). Accordingly, although the Figures and description refer to the interconnect structures 150 being interconnected between cap die 120 and a single other die 140 that forms a portion of device 100, it should be understood that, in other embodiments, one or more of the interconnect structures 150 may be interconnected between cap die 120 and one or more other die, where some or all of the other die may be distinct from device 100 (e.g., the other die may be separately packaged or otherwise distinct from device 100). In still other alternate embodiments, one or more of the interconnect structures 150 may be interconnected between cap die 120 and a conductive feature (e.g., a bonding pad or trace) of a substrate (e.g., a printed circuit board or interposer) on which the device 100 is mounted.

According to an embodiment, each interconnect structure 150 includes at least one stud bump 154 coupled to a contact 130 of cap die 120, and a wirebond coupled between a surface 156 of the stud bump 154 and a contact 146 of the control and processing die 140 (or a contact of some other circuitry). More specifically, each wirebond includes a first end 158 coupled to the surface 156 of the stud bump 154, a second end 162 coupled to the contact 146 of the control and processing die 140 (or other circuitry), and a wire 160 extending between the first and second ends 158, 162. In various alternate embodiments, the wirebond may be replaced with some other type of interconnect that extends from the surface 156 of the stud bump 154 to at least the first encapsulant top surface 182 (e.g., an interconnect that includes solder, a plated pillar, a filled via, or a combination thereof). Although a single stud bump 154 is depicted in FIG. 1, multiple stud bumps may be stacked in a vertical direction, in other embodiments. For ease of illustration and description, only a single stud bump 154 is illustrated and referred to, below.

With the exception of surface 156 and the portion of the stud bump 154 that is in physical contact with contact 130, the stud bump 154 is completely encompassed by the first encapsulant 180. As will be described in more detail below, during fabrication of device 100, the stud bump 154 is formed on contact 130 and then completely encapsulated by the first encapsulant 180. A trench 168 is subsequently formed (e.g., using a sawing process) in the first encapsulant 180 to expose the stud bump 154. The trench 168 is defined by a trench bottom surface 172 and sidewalls 174. During formation of the trench 168, a top portion of the stud bump 154 is removed (e.g., sawed through), resulting in the exposure of surface 156 of the stud bump 154 at the bottom of the trench 168. More specifically, the trench formation process results in a trench bottom surface 172 that is co-planar with the surface 156 of the stud bump 154. Because surface 156 is oriented toward the trench 168, surface 156 is referred to herein as a "trench-oriented surface" of the stud bump 154. After producing the trench-oriented surface 156 of the stud bump 154, the first end 158 of the wirebond is attached to the trench-oriented surface 156, wire 160 is extended from the first end 158, and the second end 162 of the wirebond is attached to a target contact (e.g., contact 146).

Additional trenches also may be formed to expose stud bumps in other areas of the device 100. For example, trench 170 is formed to expose a stud bump 155 that was previously deposited on a contact 131 of cap die 121, and interconnect structure 152 provides a conductive path between the contact 131 and the control and processing die 140. As FIG. 1 indicates, trenches 168, 170 may have different depths, thus allowing for access to conductive features (e.g., stud bumps 154, 155) at different depths below the top surface 182 of the first encapsulant 180 (i.e., conductive features that are not co-planar).

In an embodiment, the trench 168 is filled with second encapsulant 190 (e.g., bulk mold compound), thus encompassing portions of the interconnect structure 150 within the trench 168. In addition, in an embodiment, the control and processing die 140 and portions of the interconnect structure 150 above a top surface 182 of the first encapsulant 180 also may be covered with the second encapsulant 190, so that a top surface 102 of the device 100 corresponds to a top surface 192 of the second encapsulant 190. Conversely, a bottom surface 104 of the device is defined by a bottom surface 184 of the first encapsulant 180. Side surfaces of the device are defined by both side surfaces 186 of the first encapsulant 180 and side surfaces 194 of the second encapsulant 190. In another embodiment, only the trench 168 may be filled with the second encapsulant 190, leaving the control and processing die 140 and other portions of the top surface 182 of the first encapsulant 180 uncovered. In another alternate embodiment, the second encapsulant 190 may be excluded altogether.

According to an embodiment in which the second encapsulant 190 covers the control and processing die 140, additional conductive structures 196 may be formed between other contacts 148 of the control and processing die 140 and the top surface 192 of the second encapsulant 190, allowing for electrical access to the control and processing die 140 by external circuitry (not illustrated). In various alternate embodiments, other conductive structures configured to provide access to the control and processing die 140 and/or to the interconnect structures 150 may be implemented. For example, device 100 may also include leads (not illustrated), in an alternate embodiment. Accordingly, either the second ends 162 of the conductive structures 150 may be connected to the leads, or additional wirebonds (not illustrated) may be provided between the additional contacts 148 of the control and processing die 140 and the leads.

In the embodiment illustrated in FIG. 1, two die stacks (i.e., a first stack including die 110, 120 and a second stack including die 111, 121) are encapsulated in encapsulant (i.e., first encapsulant 180), an additional die (i.e., die 140) is connected to the top surface of the encapsulant, and interconnects (i.e., interconnects 150, 152) are formed between the die stacks and the additional die. In other embodiments, a device may include a single die stack or more than two die stacks that are interconnected to one or more target die or other structures (e.g., die that are integral with the device, such as die 140, die that are external to the device, leads, conductive structures on a substrate, and so on). In still other embodiments, a device may include two die or die stacks that are embedded together in a single encapsulant, and interconnects between the two embedded die stacks (e.g., interconnects between contact 130 and contact 131). Devices including the above-described and other configurations of die that may benefit from the embedded interconnect structures described herein are intended to be included within the scope of the inventive subject matter.

Figure 2:
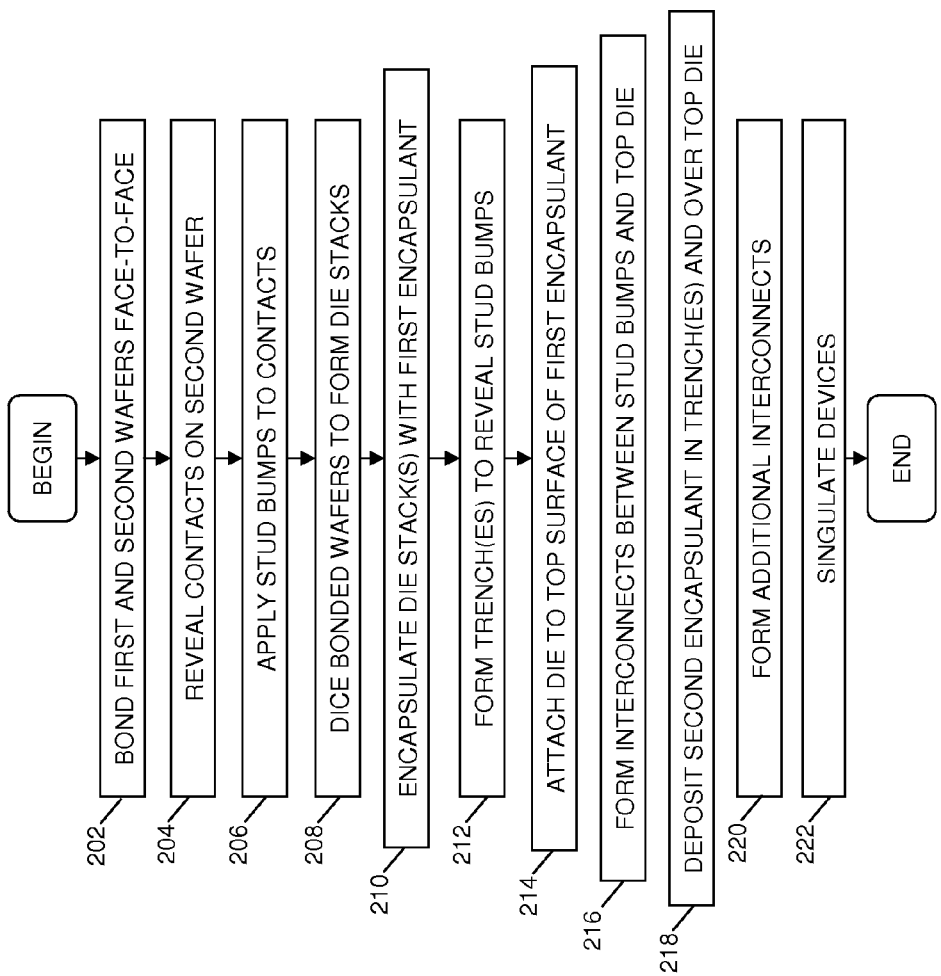
FIG. 2 illustrates a flowchart of a method of manufacturing an electronic device with embedded die and interconnect structures, in accordance with various embodiments.
Figure 12:
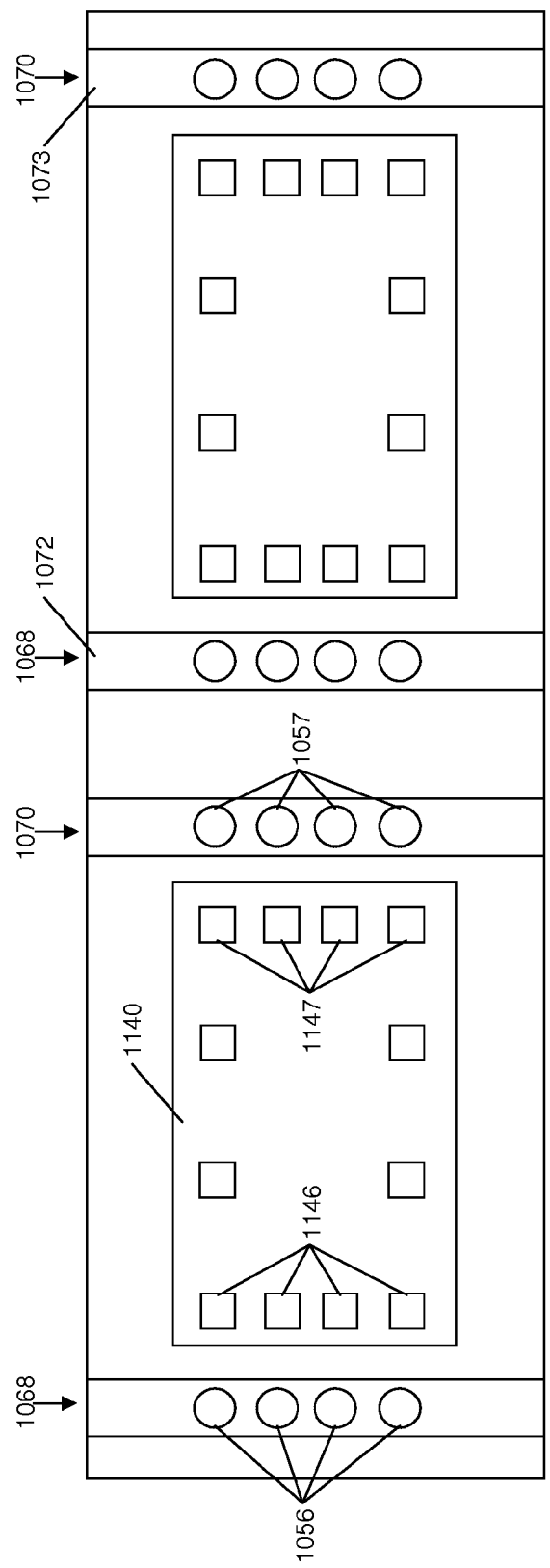

FIG. 2 illustrates a flowchart of a method of manufacturing an electronic device with embedded die and interconnect structures, in accordance with various embodiments. FIG. 2 should be viewed in conjunction with FIGS. 3-15, which illustrate various views of an electronic device during the steps of the manufacturing process of FIG. 2, in accordance with various embodiments. More specifically, FIGS. 3-11 and 13-15 illustrate cross-sectional side views, and FIG. 12 illustrates a top view of a device during various manufacturing steps.

The embodiments of the method discussed below relate to simultaneous manufacturing of multiple devices in parallel. In other words, at various stages in the process, discrete devices (or portions of devices) may be singulated from a wafer or panel that includes multiple instances of the device (or that includes other devices). For example, the embodiments illustrated in FIGS. 3-7 show the parallel fabrication of three sets of stacked die (e.g., stacked die sets 730, FIG. 7), and FIGS. 8-15 show the parallel fabrication of two devices (each including two stacked die sets). It is to be understood that, in alternate embodiments, each stacked die set and/or device may be fabricated singly, or that more than the illustrated number of stacked die sets or devices may be fabricated in parallel (e.g., an array of multiple stacked die sets and/or devices may be fabricated). It is to be understood that the aspects of the description, below, relating to parallel processing may be modified while achieving substantially the same result, and therefore such aspects are not to be construed as limiting.

According to an embodiment, the method begins in block 202 by bonding first and second wafers together in a "face-to-face" configuration. For example, referring also to FIG. 3, the bottom surface 314 of a first wafer 310 that includes multiple instances of a first integrated circuit (e.g., corresponding to multiple sensor die) is brought into contact, as indicated by arrows 302, with the top surface 322 of a second wafer 320 that includes multiple instances of a second integrated circuit (e.g., corresponding to multiple cap die). In other embodiments, each wafer 310, 320 may include multiple different types of integrated circuits, rather than each wafer 310, 320 including only a single type of integrated circuit.

According to an embodiment, the first wafer 310 includes contacts 318 on its bottom surface 314, and those contacts 318 are aligned with portions of conductive structures 326 of the second wafer 320. More specifically, the conductive structures 326 include first and second contacts 328, 330, which are electrically coupled by conductive traces or paths 336. During the alignment process, contacts 318 of the first wafer 310 are aligned with contacts 328 of the conductive structures 326. Solder or other material may be deposited on either or both contacts 318, 328 before bringing the wafers 310, 320 together, and once the wafers 310, 320 are properly aligned and brought into contact with each other, a reflow process may be performed to mechanically and electrically couple the wafers 310, 320 (via the contacts 318, 328) together with the solder. In addition or alternatively, the wafers 310, 320 may be connected using another suitable wafer-to-wafer bonding material 340 (e.g., glass frit, aluminum-germanium bonding, or other die-to-die bonding materials).

The bonding process yields a set of stacked wafers 350. According to an embodiment, the first wafer 310 includes recesses 360 in the bottom surface 314, which are aligned over contacts 330 of the conductive structures 326 during the bonding process. The recesses 360 define air cavities 362 between the bottom surface 314 of the first wafer 310 and the top surface 322 of the second wafer 320. In block 204, portions of the first wafer 310 overlying the air cavities 362 are removed. For example, the first wafer 310 may be sawed through saw streets 370 to a depth that reaches the upper extent of the air cavities 362, but does not reach the top surface 322 of the second wafer 320. As shown in FIG. 4, this process reveals the contacts 330 at the top surface 322 of the second wafer 320, and defines a contact shelf 434.

Figure 5:
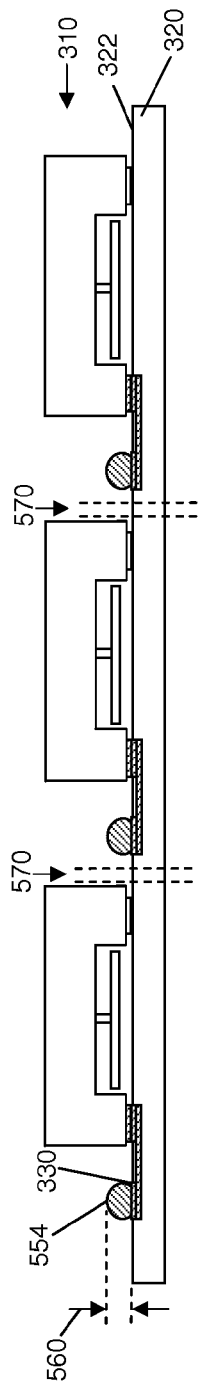

In step 206, and referring to FIG. 5, stud bumps 554 are applied to the exposed contacts 330 at the top surface 322 of the second wafer 320. According to various embodiments, the stud bumps 554 may be formed from gold, aluminum, copper, or other suitable conductive materials. For example, the stud bumps 554 may be formed using a wirebonding or wedgebonding apparatus, which is used to deposit balls (or wedges) of conductive material on contacts 330. Rather than drawing a wire from each ball or wedge, in accordance with the typical wirebonding or wedgebonding process, the apparatus may simply terminate (e.g., sever) the wire at or above each ball or wedge, yielding stud bumps 554. In other embodiments, stud bumps 554 may be formed using other methods.

Figure 6:
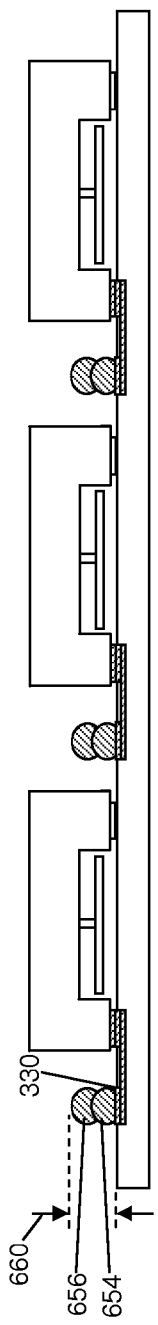

According to an embodiment, each stud bump 554 has a height 560 in a range from about 10 microns to about 100 microns, or more specifically from about 25 microns to about 50 microns. In other embodiments, the height 560 of the stud bumps 554 may be larger or smaller. In an alternate embodiment, as illustrated in FIG. 6, a stack of multiple stud bumps 654, 656 may be applied to each contact 330. In such an embodiment, it may be possible to achieve a greater height 660 of each stud bump stack than is achievable using a single stud bump (e.g., as in the embodiment illustrated in FIG. 5). Although FIG. 6 illustrates stacks of two stud bumps 654, 656, the method may include forming stacks of more than two stud bumps, as well, to achieve even higher heights. For purposes of ease of illustration, the remaining Figures depict embodiments that include only a single stud bump 554 on each contact 330.

Figure 7:
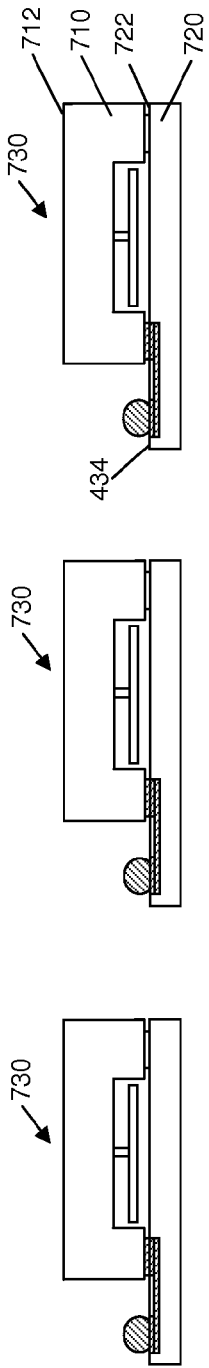

In block 208 (which alternatively may be performed before block 206), and referring again to FIG. 5, the bonded wafers 310, 320 are then diced (e.g., by sawing through saw streets 570) to form individual sets of stacked die 730, as shown in FIG. 7. Each set of stacked die 730 includes a first die 710 (e.g., a sensor die) and a second die 720 (e.g., a cap die). As indicated in FIG. 7, the contact shelf 434 defined by a portion of the top surface 722 of each second die 720 is below the top surface 712 of the first die 710. Although the illustrated embodiment shows a contact shelf 434 adjacent only one side of each first die 710, other embodiments may include contact shelves (not illustrated) adjacent two, three, or all four sides of each first die 710.

As will now be described, each stacked die set 730 may be encapsulated, in block 210, with one or more other stacked die sets, in an embodiment. Alternatively, each stacked die set 730 may be encapsulated by itself, or each stacked die set 730 may be encapsulated with other (non-stacked) die or with other components, in other embodiments. For purposes of example, the following Figures and description discuss encapsulating each stacked die set 730 with a second and different stacked die set (e.g., stacked die set 830, FIG. 8). However, the illustrated and described example is not meant to limit use of the various inventive features to only the example configuration.

According to an embodiment, and referring to FIG. 8, the encapsulation process may be carried out using a carrier 802 with tape 804 (or another adhesive) on its top surface. The process may begin by placing the top surface 712 of each first die 710 on the tape 804 (e.g., each stacked die set 730 is flipped up-side down and placed on the tape 804 so that the stud bump 554 is facing the tape 804). The top surface 832 of each second stacked die set 830 also is placed on the tape 804 at a pre-defined position relative to each first stacked die set 730. The second stacked die sets 830 also may include stud bumps 854, in an embodiment. As shown in FIG. 9, a first encapsulant 980 is then deposited between and over each stacked die set 730, 830 and cured to form a panel 910 of stacked die sets 730, 830. For example, the first encapsulant 980 may include bulk mold compound or some other suitably rigid, non-conductive material. According to an embodiment, the previously-exposed surfaces of the stud bumps 554, 854 are completely surrounded by the first encapsulant 980 (i.e., the stud bumps 554, 854 are embedded within the encapsulant 980). The panel 910 is then removed from the tape 804 and carrier 802, and flipped for further processing.

Figure 10:
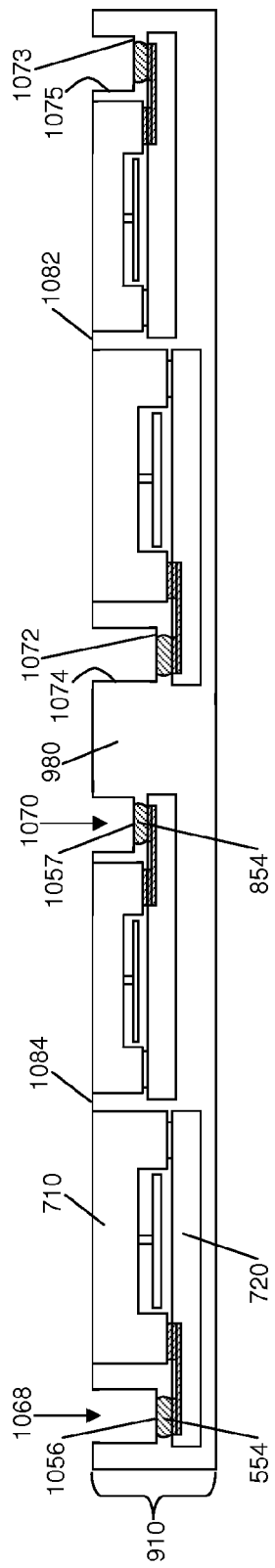
Figure 11:
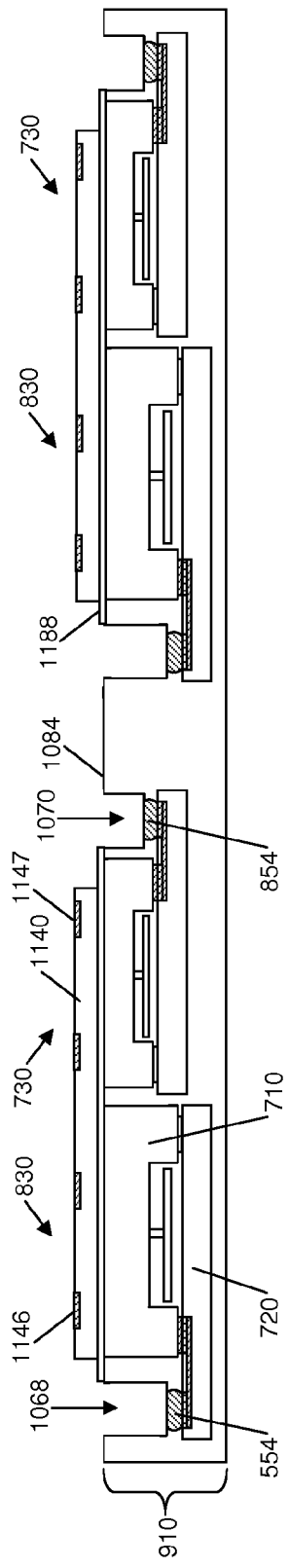

In block 212, and referring to FIG. 10, portions of the embedded stud bumps 554, 854 are revealed. For example, this may include forming trenches 1068, 1070 that extend from the top surface 1082 of the first encapsulant 980 (or the top surface 1084 of the panel 910) to, but not through, the embedded stud bumps 554, 854. For example, the trenches 1068, 1070 may be performed by sawing, etching, or performing another material removal process that is selective to the first encapsulant 980. According to an embodiment, the trenches 1068, 1070 are defined by bottom surfaces 1072, 1073 and sidewalls 1074, 1075, where top, trench-oriented surfaces 1056, 1057 of the stud bumps 554, 854 are exposed at the bottom surfaces 1072, 1073 of the trenches 1068, 1070. In an embodiment in which the trenches 1068, 1070 are formed using a sawing process, the bottom surfaces 1072, 1073 of the trenches 1068, 1070 and the trench-oriented surfaces 1056, 1057 of the stud bumps 554, 854 are co-planar. As is better illustrated in FIG. 12 (discussed later), each trench 1068, 1070 may reveal multiple stud bumps (e.g., whichever stud bumps intersect the path of the trenches 1068, 1070). In an alternate embodiment, an opening other than a trench may be formed (e.g., by drilling or etching) to reveal only a single stud bump.

At this stage of manufacture, the bottom surfaces 1072, 1073 of the trenches 1068, 1070 correspond to bonding shelves. Accordingly, wirebonds or other connectors may be connected between the trench-oriented surfaces 1056, 1057 of the stud bumps 554, 854 and one or more other devices. For example, as will be described in conjunction with FIGS. 11-15, the stud bumps 554, 854 may be connected to another die 1140 that ultimately is included with the first and second die 710, 720 in a single package. More specifically, referring to FIGS. 11 and 12, which show a cross-sectional side view and a top view, respectively, another die 1140 (e.g., a control and processing die) is coupled (e.g., using adhesive 1188) to the top surface 1084 of the panel 910. According to an embodiment, the die 1140 is attached to the panel 910 directly above the stacked die sets 730, 830, and in proximity to either or both trenches 1068, 1070. As shown more clearly in FIG. 11, trench-oriented surfaces 1056, 1057 of multiple stud bumps may be revealed at the bottom surfaces 1072, 1073 of the trenches 1068, 1070 (i.e., at the bonding shelves corresponding to the bottom surfaces 1072, 1073), and the die 1140 may include multiple contacts 1146, 1147 for potential attachment to the exposed stud bump surfaces 1072, 1073.

In block 216, and referring to FIG. 13, interconnects 1350, 1352 are formed between the stud bumps 554, 854 and target contacts 1146, 1147 of die 1140. According to an embodiment, the interconnects 1350, 1352 include wirebonds. Each wirebond has a first end 1358, 1359 coupled to the trench-oriented surface 1056, 1057 of a stud bump 554, 854, a second end 1362, 1363 coupled to a target contact 1146, 1147 of die 1140, and a wire 1360, 1361 connecting the first and second ends 1358, 1359, 1362, 1363. As discussed previously, in alternate embodiments, the second ends 1362, 1363 alternatively could be coupled to a different target (e.g., to a lead or to a device or feature that is distinct from the device). In addition, in other alternate embodiments, the wirebonds may be replaced with other types of interconnects that extend from the trench-oriented surfaces 1056, 1057 of the stud bumps 554, 854 to at least the first encapsulant top surface 1082 (e.g., interconnects that include solder, plated pillars, filled vias, or combinations thereof).

In block 218, and referring to FIG. 14, second encapsulant 1490 (e.g., bulk mold compound or another suitable material) is deposited and cured in the trenches 1068, 1070. According to an embodiment, the second encapsulant 1490 also completely encompasses the interconnects 1350, 1352 and die 1140. In alternate embodiments, the second encapsulant 1490 may be applied only in the trenches 1068, 1070 or may be excluded altogether.

Figure 15:
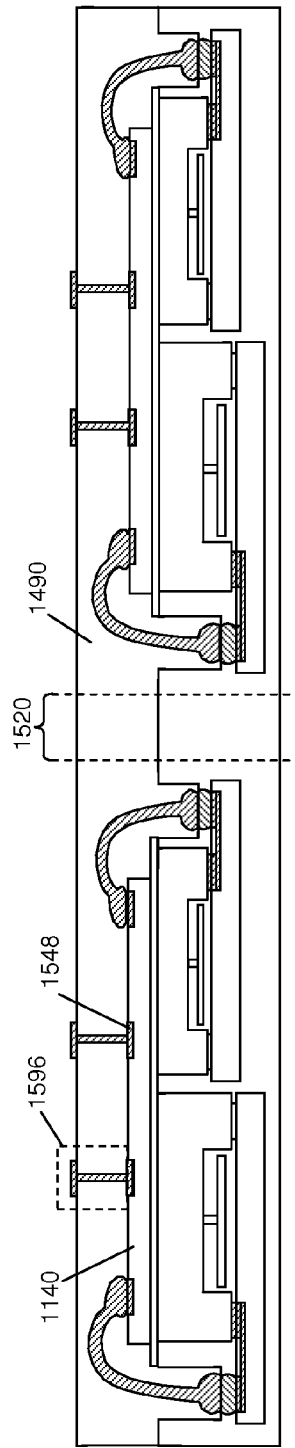

In block 220, and referring to FIG. 15, additional interconnects 1596 may be formed on and through the second encapsulant 1490, to provide for electrical interconnection with other contacts 1548 of die 1140. In block 222, the devices may be singulated from the panel 910, such as by sawing through saw streets 1520. This process yields a plurality of discrete devices (e.g., device 100, FIG. 1).

Figure 16:
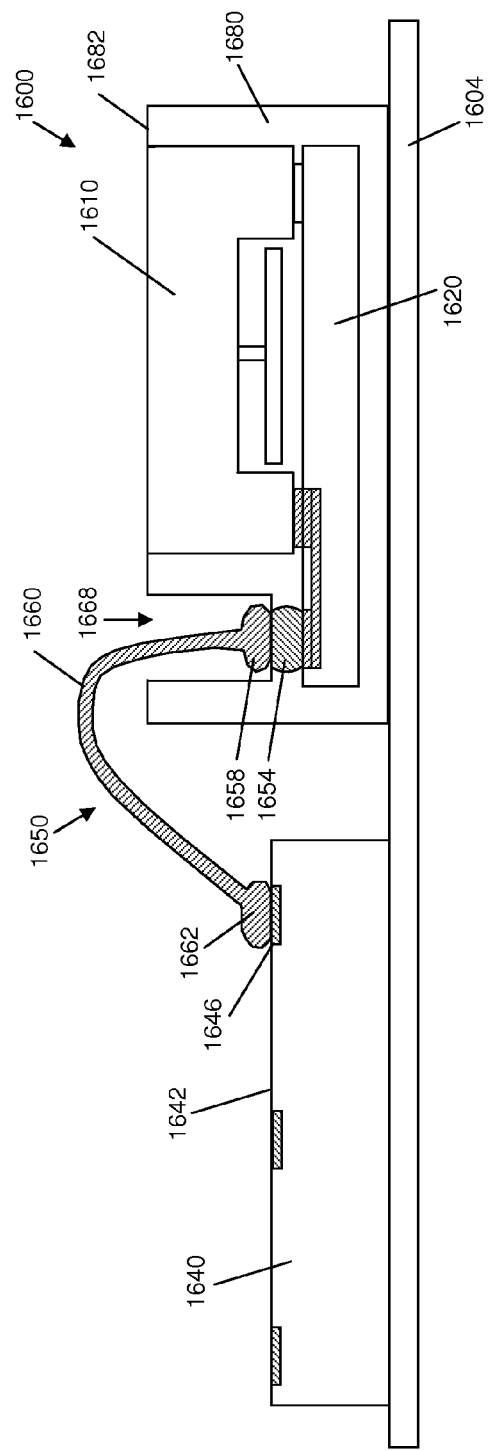
FIG. 16 illustrates a system that includes an electronic device with embedded die and embedded stud bumps, in accordance with an alternate embodiment.

As discussed previously, the interconnects (e.g., interconnects 1350, FIG. 13) to embedded stud bumps may be coupled to a separately packaged device, a distinct integrated circuit, or another conductive feature, in other embodiments. For example, FIG. 16 illustrates a system that includes an electronic device 1600 with embedded die 1610, 1620 and embedded stud bumps 1654, in accordance with an alternate embodiment. More specifically, the system includes a first electronic device 1600 and a second electronic device 1640 coupled to a substrate 1604 (e.g., a printed circuit board). The first electronic device 1600 includes one or more embedded stud bumps 1654 that are exposed at the bottom of a trench 1668 formed in the top surface 1682 of first encapsulant 1680.

The second electronic device 1640 includes one or more target contacts 1646 exposed at its top surface 1642. One or more interconnect structures 1650, each of which includes a first end 1658, a second end 1662, and a wire 1660 therebetween, are coupled between the one or more embedded stud bumps 1654 and the one or more target contacts 1646. In various alternate embodiments, the second ends 1662 of some or all of the interconnect structures 1650 alternatively may be coupled to other types of target contacts, such as a conductive feature (e.g., a bonding pad or trace) on the surface of a substrate (e.g., a printed circuit board or interposer) on which the device 1600 is mounted. The system of FIG. 16 represents just one alternate embodiment in which an embedded stud bump of a first electronic device is connected to a second, distinct electronic device. As discussed previously, embedded stud bumps could be connected to a number of different features and devices, in various embodiments.

Figure 17:
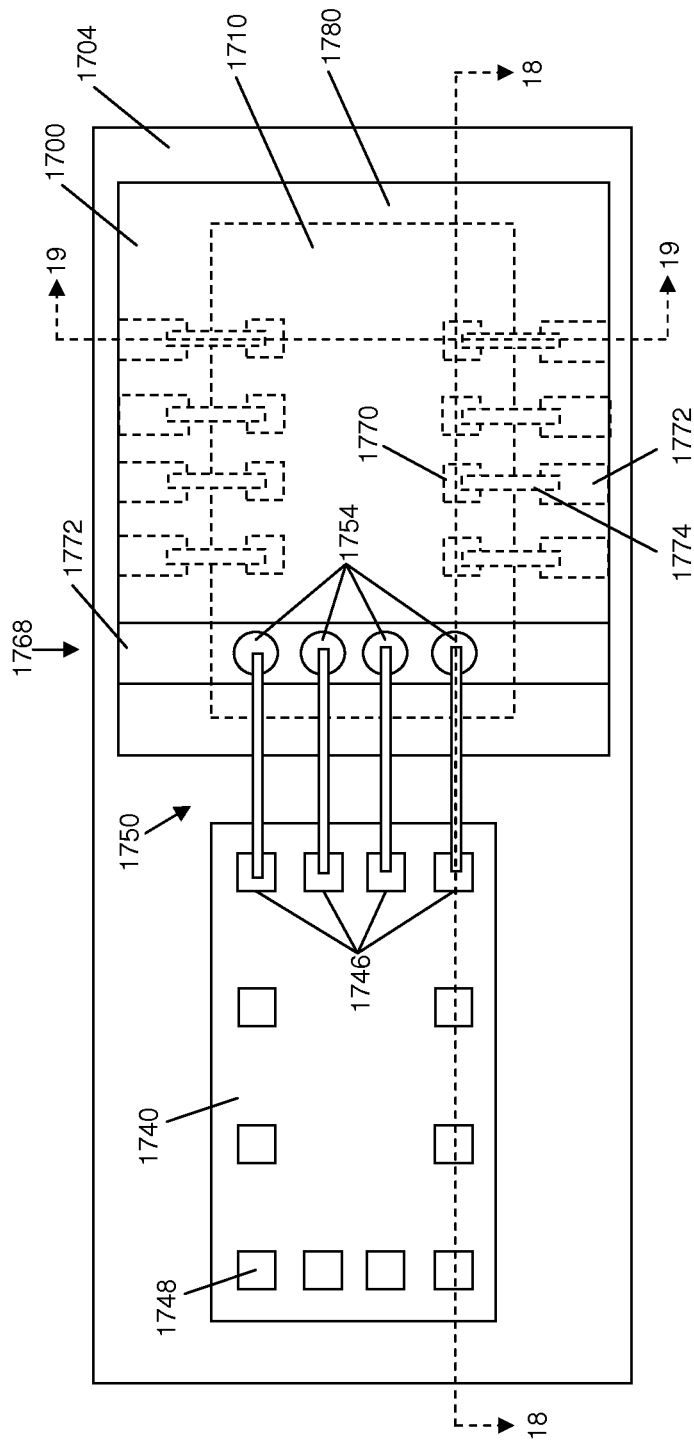

As mentioned previously, an alternate embodiment includes an electronic device that includes one or more die that are not stacked, and such an embodiment may be incorporated into a larger electronic system. For example, FIGS. 17-19 illustrate various views of a system that includes an electronic device 1700 with an embedded die 1710 and embedded stud bumps 1754, in accordance with another alternate embodiment. More particularly, FIG. 17 illustrates a top view of the system, FIG. 18 illustrates a cross-sectional, side view of the system of FIG. 17 along lines 18-18, and FIG. 19 illustrates a cross-sectional, side view of the system of FIG. 17 along lines 19-19.

Referring to FIGS. 17-19 simultaneously, the system includes a first electronic device 1700 and a second electronic device 1740 coupled to a substrate 1704 (e.g., a printed circuit board). The first electronic device 1700 includes a single die 1710 having first contacts 1830 to which multiple embedded stud bumps 1754 are coupled. The die 1710 and stud bumps 1754 are encompassed by encapsulant 1780, and the stud bumps 1754 are exposed at the bottom of a trench 1768 formed in the top surface 1882 of the encapsulant 1780. More specifically, a bottom surface of the trench defines a bonding shelf 1772 at which top surfaces of the embedded stud bumps 1754 are exposed.

In the illustrated embodiment, die 1710 is packaged in a dual-flat, no-leads type of package (i.e., a flat, no-leads package with leadframe leads 1772 on two sides of the device 1700). Accordingly, during manufacture of the electronic device 1700, stud bumps 1754 are coupled to the first contacts 1830, die 1710 is attached to a top surface of a leadframe flag 1810 (e.g., a portion of a leadframe configured to support die 1710 and function as a heat sink and/or electrical ground to the die 1710), wirebonds 1774 are coupled between second contacts 1770 of die 1710 and leadframe leads 1772, and the die 1710, stud bumps 1754, wirebonds 1774, leadframe leads 1772, and flag 1810 are subsequently overmolded with encapsulant 1780. Trench 1768 may then be formed to expose trench-oriented surfaces of the stud bumps 1754.

The first and second electronic devices 1710, 1740 may then be mechanically and electrically connected to substrate 1704, which may include additional conductive features (e.g., pads 1910 and other traces and features, not illustrated) for communicating signals and voltage references to and from the electronic devices 1710, 1740. The second electronic device 1740 includes one or more target contacts 1746 exposed at its top surface 1842. Interconnect structures 1750, each of which includes a first end 1858, a second end 1862, and a wire 1860 therebetween, are coupled between the embedded stud bumps 1754 and the target contacts 1746, in an embodiment. In various alternate embodiments, the second ends 1862 of some or all of the interconnect structures 1750 alternatively may be coupled to other types of target contacts, such as a conductive feature (e.g., a bonding pad or trace) on a surface of a substrate (e.g., a printed circuit board or interposer) on which the device 1700 is mounted. The second device 1740 may include additional contacts 1748 at its top surface 1842 or elsewhere, and those additional contacts 1748 may be coupled (e.g., wirebonded, soldered, and so on) to other portions of the system.

As illustrated in FIG. 17, electronic device 1700 includes a single die 1710, which is not stacked with any other die. In alternate embodiments, an electronic device may include multiple unstacked die, and or a combination of stacked and unstacked die, any one or more of which may include embedded stud bumps. In addition, although the embodiment illustrated in FIGS. 17-19 includes an electronic device 1710 in a dual-flat, no-leads type of package, in various alternate embodiments, an electronic device having embedded stud bumps may be packaged in a quad-flat, no-leads package, a ball grid array package, a pin grid array package, a land grid array package, a leadless chip carrier package, an in-line package, a flat pack package, a small outline integrated circuit package, and a variety of other package types. In addition, various other modifications referred to above may be made to the system and device 1700 of FIGS. 17-19 (e.g., including stacked stud bumps, increasing or decreasing the numbers of contacts and leads, including contacts and stud bumps on multiple sides of a die, including conductive structures that extend to the top surface of the package, and so on), and such modifications fall within the scope of the inventive subject matter.

Embodiments of electronic devices and manufacturing methods have been described above. An embodiment of an electronic device includes an IC die, at least one stud bump, encapsulant, and an interconnect. The IC die has a top surface and a bond pad exposed at the top surface. The at least one stud bump is connected to the bond pad, and the at least one stud bump has a trench-oriented surface. The encapsulant has an encapsulant top surface and encompasses portions of the IC die and the at least one stud bump. The encapsulant also includes a trench extending from the encapsulant top surface to the trench-oriented surface of the at least one stud bump. However, the encapsulant does not cover the trench-oriented surface. The interconnect extends from the trench-oriented surface of the at least one stud bump to at least the encapsulant top surface.

An embodiment of a method of manufacturing an electronic device includes connecting at least one stud bump to a first bond pad of an IC die, and encapsulating the IC die and the at least one stud bump with encapsulant having an encapsulant top surface. The method further includes forming a trench in the encapsulant extending from the encapsulant top surface to the at least one stud bump, resulting in a formation of a trench-oriented surface of the at least one stud bump, where the trench-oriented surface is exposed at a bottom of the trench. An end of an interconnect is connected to the trench-oriented surface of the at least one stud bump, and the interconnect extends above the encapsulant top surface.

Another embodiment of method of manufacturing an electronic device includes forming a set of stacked die by bonding a top surface of a first IC die to a bottom surface of a second IC die. The first IC die includes a first bond pad on the top surface of the first IC die. The method further includes connecting at least one stud bump to the first bond pad, encapsulating the set of stacked die and the at least one stud bump with first encapsulant having an encapsulant top surface, and forming a trench in the first encapsulant extending from the encapsulant top surface to the at least one stud bump, resulting in a formation of a trench-oriented surface of the at least one stud bump, wherein the trench-oriented surface is exposed at a bottom of the trench. A first end of a wirebond is connected to the trench-oriented surface of the at least one stud bump, and the wirebond includes a wire extending beyond the encapsulant top surface.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electronic device comprising:
  a first stacked die set that includes
    a first integrated circuit (IC) die having a top surface and a bottom surface,
    a first cap die having a top surface that is bonded to the bottom surface of the first IC die, a first bond pad exposed at the top surface of the first cap die, and a conductive structure between the bottom surface of the first IC die and the first bond pad, and
    at least one first stud bump connected to the first bond pad and having a first trench-oriented surface;
  a second stacked die set positioned next to the first stacked die set, wherein the second stacked die set includes a second IC die having a top surface and a bottom surface, wherein the top surfaces of the first and second IC die are co-planar,
a second cap die having a top surface that is bonded to the bottom surface of the second IC die, a second bond pad exposed at the top surface of the second cap die, and a conductive structure between the bottom surface of the second IC die and the second bond pad, wherein the first and second bond pads are not co-planar, and
at least one second stud bump connected to the second bond pad and having a second trench-oriented surface;
first encapsulant having an encapsulant top surface and encompassing and contacting at least a portion of the first IC die, at least a portion of the second IC die, at least a portion of the first cap die, at least a portion of the second cap die, at least a portion of the at least one first stud bump, and at least a portion of the at least one second stud bump, wherein the first encapsulant includes a first trench extending from the encapsulant top surface to the first trench-oriented surface of the at least one first stud bump, and a second trench extending from the encapsulant top surface to the second trench-oriented surface of the at least one second stud bump, wherein the first encapsulant does not cover the first and second trench-oriented surfaces, wherein a surface of the first encapsulant defining a first trench bottom surface is co-planar with the first trench-oriented surface of the at least one first stud bump, and wherein a surface of the first encapsulant defining a second trench bottom surface is co-planar with the second trench oriented surface of the at least one second stud bump;
a first wirebond coupled to the first trench-oriented surface of the at least one first stud bump and extending from the first trench-oriented surface of the at least one first stud bump to at least the encapsulant top surface; and
a second wirebond coupled to the second trench-oriented surface of the at least one second stud bump and extending from the second trench-oriented surface of the at least one second stud bump to at least the encapsulant top surface.

2. The electronic device of claim 1, further comprising:
second encapsulant filling the first and second trenches and encompassing portions of the wirebonds within the first and second trenches.

3. The electronic device of claim 1, wherein the at least one first stud bump comprises a single stud bump having a height in a range of about 25 microns to about 50 microns.

4. The electronic device of claim 1, wherein each stud bump of the at least one first stud bump comprises an end of a wirebond.

5. The electronic device of claim 1, wherein the at least one first stud bump comprises a stack of multiple stud bumps, wherein each of the multiple stud bumps has a height in a range of about 25 microns to about 50 microns, and a top stud bump of the multiple stud bumps has the first trench-oriented surface.

6. The electronic device of claim 1, wherein the first cap die further includes multiple additional bond pads, and wherein the electronic device further comprises:
multiple additional stud bumps connected to the multiple additional bond pads, wherein the first trench extends from the encapsulant top surface to trench-oriented surfaces of the multiple additional stud bumps; and
multiple additional wirebonds connected to the trench-oriented surfaces of the multiple additional stud bumps, wherein each of the multiple additional wirebonds extend from a trench-oriented surface of one or the multiple additional stud bumps to at least the encapsulant top surface.

7. The electronic device of claim 1, further comprising:
a third IC die having a bottom surface, a top surface, and a third bond pad exposed at the top surface of the third IC die, wherein the bottom surface of the third IC die is coupled to the encapsulant top surface, and the first wirebond further includes a second end connected to the third bond pad.

8. The electronic device of claim 1, wherein a second end of the first wirebond is connected to a target contact selected from a contact of a separately packaged electronic device, a contact of a distinct integrated circuit die, a bonding pad on the surface of a substrate, and a trace on the surface of a substrate.

9. The device of claim 1, wherein the first and second trenches have different depths.

10. A method of manufacturing an electronic device, the method comprising the steps of:
forming a first stacked die set by
bonding a top surface of a first cap die to a bottom surface of a first integrated circuit (IC) die, wherein the first cap die has a first bond pad exposed at the top surface of the first cap die, and a conductive structure between the bottom surface of the first IC die and the first bond pad, and
connecting at least one first stud bump to the first bond pad of the first cap die, wherein the at least one first stud bump has a first trench-oriented surface;
forming a second stacked die set by
bonding a top surface of a second cap die to a bottom surface of a second IC die, wherein the second cap die has a second bond pad exposed at the top surface of the second cap die, and a conductive structure between the bottom surface of the second IC die and the second bond pad, wherein the first and second bond pads are not co-planar, and
connecting at least one second stud bump to the second bond pad of the second cap die, wherein the at least one second stud bump has a second trench-oriented surface;
while the first and second stacked die sets are arranged so that the top surfaces of the first and second IC die are co-planar, encapsulating the first IC die, the second IC die, the first cap die, the second cap die, the at least one first stud bump, and the at least one second stud bump with first encapsulant having an encapsulant top surface, wherein the first encapsulant encompasses and contacts at least a portion of the first IC die and at least a portion of the at least one stud bump;
forming a first trench in the first encapsulant extending from the encapsulant top surface to the at least one first stud bump, resulting in a formation of a first trench-oriented surface of the at least one first stud bump, wherein the first trench-oriented surface is exposed at a bottom of the first trench, and wherein a surface of the first encapsulant defining a first trench bottom surface is co-planar with the first trench-oriented surface of the at least one first stud bump;
connecting a first end of a first wirebond to the first trench-oriented surface of the at least one first stud bump, wherein the first wirebond extends above the encapsulant top surface;
forming a second trench in the first encapsulant extending from the encapsulant top surface to the at least one second stud bump, resulting in a formation of a second trench-oriented surface of the at least one second stud bump, wherein the second trench-oriented surface is exposed at a bottom of the second trench, and wherein a surface of the first encapsulant defining a second trench bottom surface is co-planar with the second trench-oriented surface of the at least one second stud bump; and connecting a first end of a second wirebond to the second trench-oriented surface of the at least one second stud bump, wherein the second wirebond extends above the encapsulant top surface.

11. The method of claim 10, further comprising:
filling the first and second trenches with second encapsulant, wherein the second encapsulant encompasses portions of the wirebonds within the first and second trenches.

12. The method of claim 10, further comprising:
coupling a bottom surface of a third IC die to the encapsulant top surface, wherein the third IC die includes a top surface and a third bond pad exposed at the top surface of the third IC die; and
connecting a second end of the first wirebond to the third bond pad.

13. The method of claim 10, further comprising:
connecting a second end of the first wirebond to a target contact selected from a contact of a separately packaged electronic device, a contact of a distinct integrated circuit die, a bonding pad on the surface of a substrate, and a trace on the surface of a substrate.

14. The method of claim 10, wherein the first and second trenches have different depths.

15. A method of manufacturing an electronic device, the method comprising the steps of:
forming a first set of stacked die by bonding a top surface of a first IC die to a bottom surface of a second IC die, wherein the first IC die includes a first bond pad on the top surface of the first IC die;
connecting at least one first stud bump to the first bond pad;
forming a second set of stacked die by bonding a top surface of a third IC die to a bottom surface of a fourth IC die, wherein the third IC die includes a second bond pad on the top surface of the third IC die;
connecting at least one second stud bump to the second bond pad;
while the first and second sets of stacked die are arranged so that the top surfaces of the second and fourth IC die are co-planar and first and second bond pads are not co-planar, encapsulating the first and second sets of stacked die and the at least one first and second stud bump with first encapsulant having an encapsulant top surface, wherein the first encapsulant encompasses and contacts at least a portion of the first and third IC die and at least a portion of the at least one first and second stud bumps;

forming first and second trenches in the first encapsulant extending from the encapsulant top surface to the at least one first and second stud bumps, resulting in a formation of a first trench-oriented surface of the at least one first stud bump and a second trench-oriented surface of the at least one second stud bump, wherein the first and second trench-oriented surfaces are exposed at bottoms of the first and second trenches, and wherein a surface of the first encapsulant defining a first trench bottom surface is co-planar with the first trench-oriented surface of the at least one first stud bump, and a surface of the first encapsulant defining a second trench bottom surface is co-planar with the second trench-oriented surface of the at least one second stud bump;

connecting a first end of a first wirebond to the first trench-oriented surface of the at least one first stud bump, wherein the first wirebond includes a first wire extending beyond the encapsulant top surface; and connecting a first end of a second wirebond to the second trench-oriented surface of the at least one second stud bump, wherein the second wirebond includes a second wire extending beyond the encapsulant top surface.

16. The method of claim 15, wherein the step of forming the first set of stacked die comprises:
bonding a top surface of a first semiconductor wafer that includes the first IC die with a bottom surface of a second semiconductor wafer that includes the second IC die, wherein the top surface of the first IC die is co-planar with the top surface of the first semiconductor wafer, and the bottom surface of the second IC die is co-planar with the bottom surface of the second semiconductor wafer;
forming a trench through the second semiconductor wafer to expose the first bond pad; and
separating the first IC die and the second IC die from other portions of the first and second semiconductor wafers to form the set of stacked die.

17. The method of claim 15, further comprising:
filling the first and second trenches with second encapsulant, wherein the second encapsulant encompasses portions of the wirebonds within the first and second trenches.

18. The method of claim 17, further comprising:
coupling a bottom surface of a fifth IC die to the encapsulant top surface, wherein the fifth IC die includes a third bond pad exposed at a top surface of the fifth IC die; and
connecting a second end of the first wirebond to the third bond pad, and
wherein the step of filling the first and second trenches with the second encapsulant comprises also encapsulating the fifth IC die with the second encapsulant.

19. The method of claim 15, wherein the first and second trenches have different depths.

* * * * *